(12) United States Patent
Xie et al.

(10) Patent No.: US 11,217,489 B1
(45) Date of Patent: Jan. 4, 2022

(54) MANUFACTURING METHOD OF CMOS INVERTER

(71) Applicant: TCL China Star Optoelectronics Technology Co., Ltd., Shenzhen (CN)

(72) Inventors: Huafei Xie, Shenzhen (CN); Shujhih Chen, Shenzhen (CN); Chiayu Lee, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 143 days.

(21) Appl. No.: 16/758,051

(22) PCT Filed: Jan. 7, 2020

(86) PCT No.: PCT/CN2020/070613
§ 371 (c)(1),
(2) Date: Apr. 22, 2020

(87) PCT Pub. No.: WO2021/128467
PCT Pub. Date: Jul. 1, 2021

(30) Foreign Application Priority Data

Dec. 24, 2019 (CN) .......................... 201911349982.4

(51) Int. Cl.
*H01L 21/8238* (2006.01)
*H01L 29/66* (2006.01)
*H01L 21/02* (2006.01)
*H01L 27/28* (2006.01)
*H01L 51/00* (2006.01)

(52) U.S. Cl.
CPC ................ *H01L 21/823807* (2013.01); *H01L 21/02565* (2013.01); *H01L 21/02628* (2013.01); *H01L 27/286* (2013.01); *H01L 29/66969* (2013.01); *H01L 51/0003* (2013.01)

(58) Field of Classification Search
CPC ......... H01L 21/02521; H01L 21/02527; H01L 21/02554; H01L 21/02565; H01L 21/02623; H01L 21/02628; H01L 21/8238; H01L 21/823807; H01L 21/823871; H01L 27/28; H01L 27/283; H01L 27/286; H01L 29/66007; H01L 29/66015; H01L 29/66037; H01L 29/66045; H01L 29/66969; H01L 29/772; H01L 29/7831; H01L 29/786; H01L 29/78645; H01L 29/7869; H01L 29/78696; H01L 51/0002;
(Continued)

(56) References Cited

U.S. PATENT DOCUMENTS

| | | |
|---|---|---|
| 2015/0108429 A1 | 4/2015 | Uppili |
| 2019/0109238 A1 | 4/2019 | Zhang et al. |
| 2020/0152800 A1 | 5/2020 | Zhou et al. |

FOREIGN PATENT DOCUMENTS

| | | |
|---|---|---|
| CN | 104201112 | 12/2014 |
| CN | 104576744 | 4/2015 |

(Continued)

*Primary Examiner* — Cheung Lee

(57) ABSTRACT

The present disclosure provides a manufacturing method of a complementary metal-oxide-semiconductor (CMOS) inverter includes annealing a substrate printed with an oxide ink to obtain a first active layer, printing a carbon tube ink between a first source and the first drain to form a second active layer for obtaining a first thin-film transistor (TFT), forming a second source and a second drain on two sides of the first active layer to obtain a second TFT, and forming wires between the first TFT and the second TFT.

20 Claims, 5 Drawing Sheets

(58) Field of Classification Search
CPC ............. H01L 51/0003; H01L 51/0004; H01L 51/0005; C23C 18/1208; C23C 18/1216
See application file for complete search history.

(56) References Cited

FOREIGN PATENT DOCUMENTS

| | | |
|---|---|---|
| CN | 107527956 | 12/2017 |
| CN | 107768309 | 3/2018 |
| CN | 107799521 | 3/2018 |

MANUFACTURING METHOD OF CMOS INVERTER

RELATED APPLICATIONS

This application is a National Phase of PCT Patent Application No. PCT/CN2020/070613 having International filing date of Jan. 7, 2020, which claims the benefit of priority of Chinese Patent Application No. 201911349982.4 filed on Dec. 24, 2019. The contents of the above applications are all incorporated by reference as if fully set forth herein in their entirety.

FIELD AND BACKGROUND OF THE INVENTION

The present disclosure relates to the field of display technologies, more particularly, to a manufacturing method of a complementary metal-oxide-semiconductor inverter.

Thin-film transistors (TFTs) are key components of liquid crystal display (LCD) and active matrix organic light-emitting diode (AMOLED) display panels, and are mainly applied on driving circuits of display panels.

Most oxide-based complementary metal-oxide-semiconductor (CMOS) logic components adopt hybrid structures of P-type organic TFTs and N-type oxide TFTs. However, a various semiconductor active layers will increase the complexity of circuit design and fabrication in practical applications. Organic TFTs have lower hole mobility (<2 cm2V$^{-1}$S$^{-1}$), shorter life time, worse uniformity between components, and worse stability under oxygen and humid environments. The processability of organic material is also worse. In addition, a mobility of N-type organic semiconductors is lower than a mobility of P-type organics (0.01 to 0.1 cm2V$^{-1}$S$^{-1}$), which makes it more difficult for applying organic semiconductors to complex functional circuits, such as CMOS logic circuits. As a result, existing CMOS inverter has larger power consumption and worse stability.

Therefore, a manufacturing method of a CMOS inverter is required to solve the existing technical problems.

SUMMARY OF THE INVENTION

An object of the present disclosure is providing a manufacturing method of a complementary metal-oxide-semiconductor (CMOS) inverter to reduce power consumption and enhance stability.

To solve the technical problems above, the present disclosure provides a manufacturing method of a CMOS inverter, including:

Printing an oxide ink on a substrate, annealing the substrate printed with the oxide ink, and reacting the oxide ink to obtain a first active layer. The oxide ink is a mixed solution of indium nitrate and zinc nitrate; a molar ratio of the indium nitrate to the zinc nitrate is 1:1, and the substrate includes a gate;

Forming a first source and a first drain on the substrate, and printing a carbon tube ink between the first source and the first drain to form a second active layer for obtaining a first thin-film transistor (TFT). The carbon tube ink includes semiconductor carbon nanotube and polymer, and the polymer wraps the semiconductor carbon nanotube;

Forming a second source and a second drain on two sides of the first active layer to obtain a second TFT; and Forming wires between the first TFT and the second TFT to obtain a CMOS inverter. The first TFT and the second TFT share the gate.

The present disclosure further provides a manufacturing method of a CMOS inverter, including:

Printing an oxide ink on a substrate, annealing the substrate printed with the oxide ink, and reacting the oxide ink to obtain a first active layer. The oxide ink is a mixed solution of indium nitrate and zinc nitrate;

Forming a first source and a first drain on the substrate, and printing a carbon tube ink between the first source and the first drain to form a second active layer for obtaining a first TFT. The carbon tube ink includes semiconductor carbon nanotube and polymer, and the polymer wraps the semiconductor carbon nanotube;

Forming a second source and a second drain on two sides of the first active layer to obtain a second TFT.

Forming wires between the first TFT and the second TFT to obtain a CMOS inverter.

The manufacturing method of the CMOS inverter of the present disclosure includes printing an oxide ink on a substrate, annealing the substrate printed with the oxide ink, and reacting the oxide ink to obtain a first active layer. The oxide ink is a mixed solution of indium nitrate and zinc nitrate. Forming a first source and a first drain on the substrate, and printing a carbon tube ink between the first source and the first drain to form a second active layer for obtaining a first TFT.

The carbon tube ink includes semiconductor carbon nanotube and polymer, and the polymer wraps the semiconductor carbon nanotube. Forming a second source and a second drain on two sides of the first active layer to obtain a second TFT and forming wires between the first TFT and the second TFT to obtain a CMOS inverter. Power consumption is reduced and stability is enhanced by adopting solution manufacturing processes.

DESCRIPTION OF SPECIFIC EMBODIMENTS OF THE INVENTION

Figure 1:
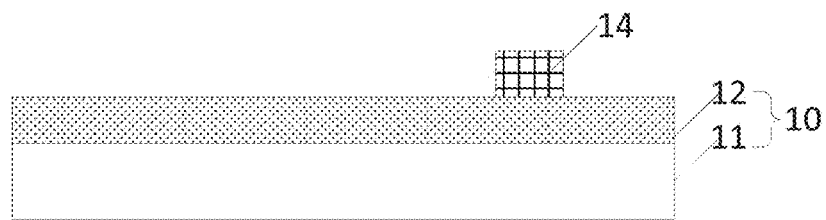
FIG. 1 illustrates a structural diagram of a first portion of a first step of a manufacturing method of a complementary metal-oxide-semiconductor (CMOS) inverter of the present disclosure.

The following description of the various embodiments is provided with reference of drawings to illustrate specific embodiments. Directional terms mentioned in the present disclosure, such as upper, lower, front, back, left, right, inside, outside, lateral, etc., are only referring to the direction of the drawing. Therefore, the directional terms used to describe and clarify the present disclosure should not be viewed as limitations of the present disclosure. In the drawing, structurally similar elements are denoted by the same reference numbers.

Please refer to FIG. 1 to FIG. 5. FIG. 1 illustrates a structural diagram of a first portion of a first step of a manufacturing method of a complementary metal-oxide-semiconductor (CMOS) inverter of the present disclosure.

In one embodiment, the manufacturing method of the CMOS inverter of the present disclosure includes the following steps.

Step S101: printing an oxide ink on a substrate, annealing the substrate printed with the oxide ink, and reacting the oxide ink to obtain a first active layer.

Figure 2:
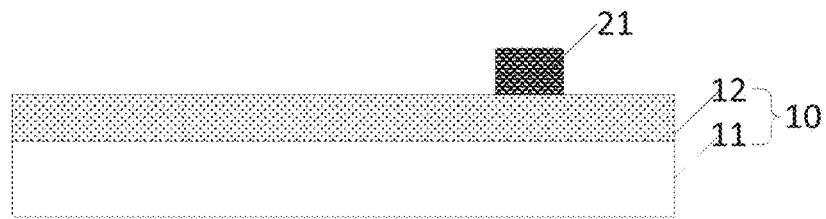
FIG. 2 illustrates a structural diagram of a second portion of the first step of the manufacturing method of the CMOS inverter of the present disclosure.

For example, as shown in FIG. 1 and FIG. 2, the substrate 10 includes a base 11 and an insulating layer 12. The insulating layer 12 is disposed on the base 11. A material of the base 11 is silicon or glass. A material of the insulating layer 12 includes at least one of HfO2, Al2O3, and SiO2. In order to improve a conductivity of a thin-film transistor (TFT), the thickness of the insulating layer 12 may range from 50 nm to 100 nm. The substrate 10 further includes a gate located between the insulating layer 12 and the base 11. A first TFT 30 and a second TFT 20 share one gate.

The oxide ink is a mixed solution of indium nitrate and zinc nitrate. In one embodiment, in order to improve the conductivity of the TFT, a concentration of the oxide ink ranges from 0.1 mol/L to 0.4 mol/L.

A molar ratio of the indium nitrate to the zinc nitrate is 1:1. The oxide ink 14 is printed on the substrate 10. The substrate 10, which is printed with the oxide ink, is annealed so that the oxide ink reacts to obtain the first active layer 21.

A step of annealing the substrate printed with the oxide ink including the following steps.

(1) Annealing the substrate printed with the oxide ink by using heating equipment. A heating temperature of the heating equipment ranges from 250° C. to 350° C.

The heating equipment can be a muffle furnace or, obviously, can also be other heating equipment. Indium zinc oxide is obtained by using, for example, the muffle furnace at 250-350° C. to anneal for 2 to 3 hours.

In one embodiment, in order to improve the efficiency of manufacturing processes, following steps are provided after the step of printing the oxide ink on the substrate and before the step of annealing the substrate printed with the oxide ink.

Step S1011: heating the substrate printed with the oxide ink.

In one embodiment, after mixing the indium nitrate and the zinc nitrate, the solution is pretreated by a hot station at 275° C. for 20 to 30 minutes. After cooled to room temperature, the solutions is annealed at 250-350° C. by the muffle furnace for 2-3 hours to obtain indium zinc oxide, thereby the first active layer 21 is obtained.

Step S102: forming a first source and a first drain on the substrate, and printing a carbon tube ink between the first source and the first drain to form a second active layer for obtaining the first TFT.

The carbon tube ink includes semiconductor carbon nanotube and polymer. The polymer wraps the semiconductor carbon nanotube. In order to improve the conductivity of the TFT, a concentration of the carbon tube ink ranges from 0.0001 mg/mL to 1 mg/mL.

Figure 3:
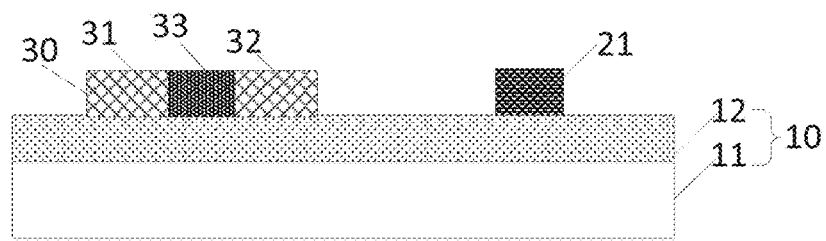
FIG. 3 illustrates a structural diagram of a second step of the manufacturing method of the CMOS inverter of the present disclosure.

As shown in FIG. 3, a first metal material is evaporated on the substrate 10 by an electron beam to form a first metal layer. Then, the first metal layer forms a source and a drain, i.e., the first source 31 and the first drain 32, by photolithography to. The first metal material may be copper.

Then, printing a carbon tube ink between the first source 31 and the first drain 32 to form a second active layer 33 for obtaining the first TFT 30. The first TFT 30 is a carbon nanotube transistor.

Step S103: forming a second source and a second drain on two sides of the first active layer to obtain a second TFT.

Figure 4:
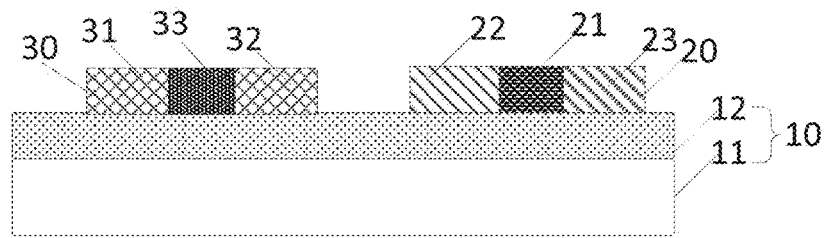
FIG. 4 illustrates a structural diagram of a third step of the manufacturing method of the CMOS inverter of the present disclosure.

As show in FIG. 4, the second source 22 and the second drain 23 are formed on two sides of the first active layer 21 to obtain the second TFT 20. The second TFT 20 is an oxide transistor.

In one embodiment, a second metal material is vapored on both sides of the first active layer 21 to obtain the second source and the second drain. The second metal material may be aluminum.

Step S104: forming wires between the first TFT and the second TFT to obtain a CMOS inverter.

Figure 5:
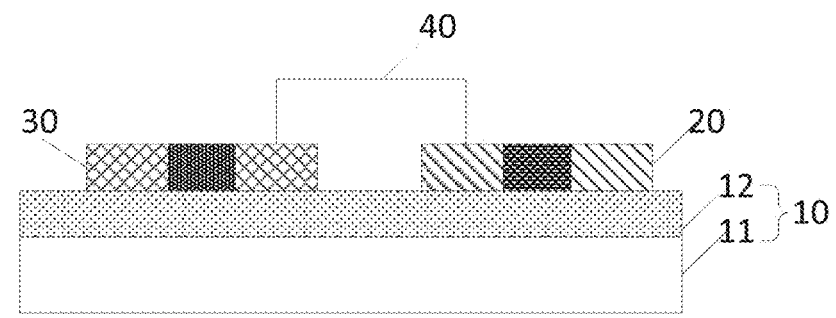
FIG. 5 illustrates a structural diagram of a fourth step of the manufacturing method of the CMOS inverter of the present disclosure.

As shown in FIG. 5, wires 40 are formed between the first TFT 30 and the second TFT 20 to obtain the CMOS inverter. The wires 40 are utilized to connect the first drain and the second drain. The first TFT 30 is a P-type TFT. The second TFT 20 is an N-type TFT.

The step of printing the oxide ink on the substrate further includes the following steps.

Step S201: washing the substrate by using ultraviolet or plasma.

For example, ultraviolet or plasma is used to wash the substrate for a preset time (for example, 5-15 minutes).

In a specific embodiment, the manufacturing method of the CMOS inverter further includes the following steps.

(1) Preparing the indium zinc nitrate solution which has the concentration ranging from 0.1 mol/L to 0.4 mol/L. A solvent can be organic solvent or water.

Figure 6:
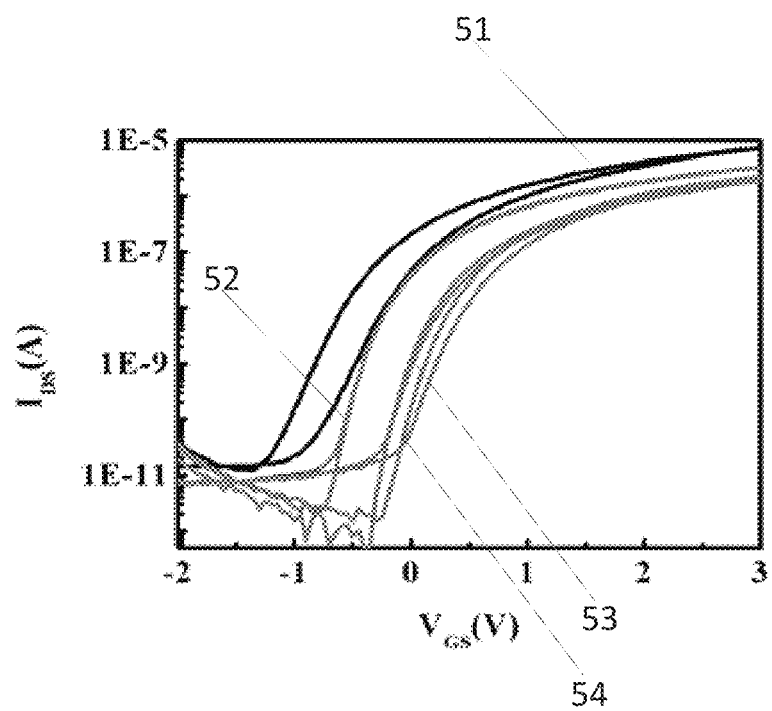
FIG. 6 illustrates a transistor transfer curve diagram of different oxide inks.

It is found that transistor performance is affected by different dielectric materials and different thickness of dielectric layers from experiments. The ink printed on the substrate can be different, for example, oxide ink IO (InO), 6:1:2 IGZO (molar ratio of In:Ga:Zn is 6:1:2), 3:1:2 IGZO (molar ratio of In:Ga:Zn is 3:1:2), and 1:1 IZO (InZnO). The ink concentration is 0.2 mol/L. The source and drain are formed by thermally evaporating with Al. As shown in FIG. 6, the ordinate represents the driving current IDS, and the abscissa represents the threshold voltage (gate-source voltage Vgs) of the TFT, where 51 to 54 represent the transfer curve of the transistor corresponding to IO, 6:1:2 IGZO, 3:1:2 IGZO, and IZO respectively. VDS is 0.5V. The driving current is proportional to the concentration of indium. Therefore, if the indium content increases, both the on-state current and the off-state current of the TFT increase, and the threshold voltage gradually moves to the left. This embodiment adopts 1:1 IZO ink as an example.

(2) A heavily doped Si wafer is selected for ultrasonic cleaning, and then a 50 nm insulating layer was formed.

The material of the insulating layer can be $HfO_2$, $Al_2O_3$, or $SiO_2$. It is found that transistor performance is affected by different dielectric materials and different thickness of dielectric layers from experiments.

Figure 7:
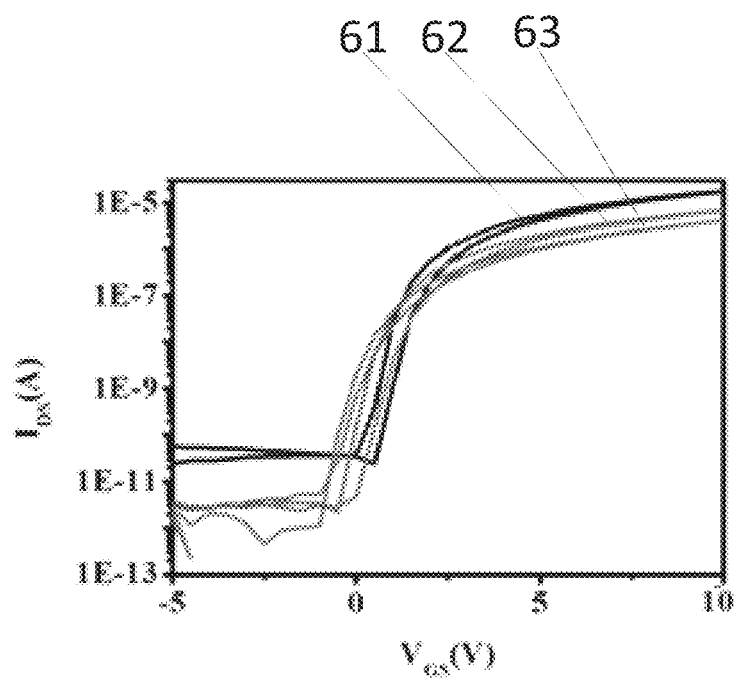
FIG. 7 illustrates a transistor transfer curve diagram of different dielectric materials.
Figure 8:
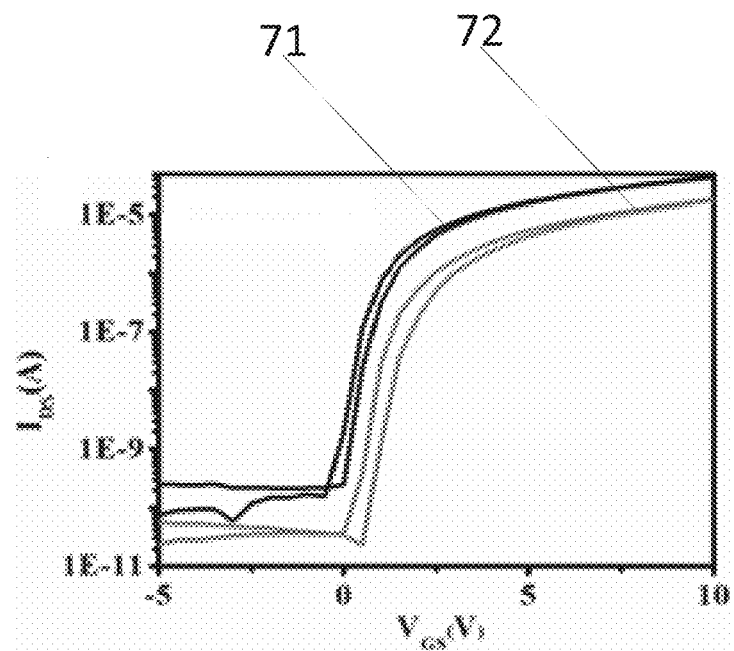
FIG. 8 illustrates a transistor transfer curve diagram of different thickness in the same dielectric material.

For example, the source and the drain can be thermally evaporated on $Al_2O_3$/Si substrate (100 nm), $HfO_2$/Si substrate (100 nm), SiO2/Mo glass substrate (100 nm) with 0.2 mol of 6:1:2 IGZO (In:Ga:Zn=6:1:2) ink. In FIG. 7, the ordinate represents the driving current IDS, the abscissa represents the threshold voltage of the TFT, and 61 to 63 represent the transfer curves of the transistors corresponding to HfO2, Al2O3, and SiO2, where HfO2, Al2O3, and SiO2 have the same concentration and thickness. VDS is 1 V. For the same ink concentration and the same dielectric layer thickness, $Vth(SiO2)>Vth(Al2O3)>Vth(HfO_2)$. In FIG. 8, 71 and 72 respectively represent the transfer curves of the transistors corresponding to $HfO_2$/Si substrate having thickness of 50 nm and 100 nm, where the concentration of HfO2 is the same. For the same ink concentration and the same material (HfO2), if the thickness of the insulating layer increases, the threshold voltage of the TFT also gradually increases.

(3) Preparing substrate under ultraviolet for 5 to 15 minutes. The prepared indium zinc nitrate solution is transferred to the insulating layer by inkjet printing.

For example, after the oxide ink, which is used for printing, is pre-processed at 275° C. for 20 to 30 minutes, the muffle furnace anneals at 250-350° C. for 2-3 hours after the oxide ink is cooled to room temperature (heating rate is not higher than 10° C./min).

(4) Using a photolithography process and an electron beam evaporation process to form an Au electrode on a substrate printed with an oxide film as a source and drain of the carbon nanotube transistor.

Oxygen plasma (o-plasma) treatment of the substrate for 2-5 min or UV treatment of the substrate for 20-50 min is utilized to transfer, by aerosol printing, ink from high-purity semiconductor carbon nanotubes coated and separated by polymer to the channel between the source and the drain. The source and the drain are formed by Au material. the carbon tube ink is baked at 60° C. for about 2 minutes after each printing or drip coating by aerosol printer or drip coating, then is washed with toluene, then baked at 60° C. for 2 minutes, repeat two or three times, and finally baked at 120° C. for 30 minutes, deposition of the carbon tube is completed.

(5) Forming the source and the drain of the oxide transistor by thermal evaporating Al.

For example, a mask and a vacuum evaporation method can be adopted. An indium zinc oxide semiconductor film is used as an oxide semiconductor channel layer to form an aluminum source electrode and an aluminum drain electrode on the indium zinc oxide semiconductor film. A thickness of the source and a thickness of the drain range from 100 nm to 170 nm.

Figure 9:
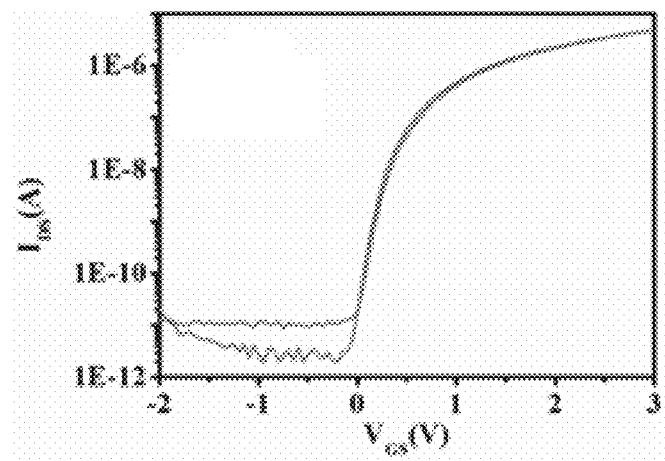
FIG. 9 illustrates a transistor transfer curve diagram of a second thin-film transistor.
Figure 10:
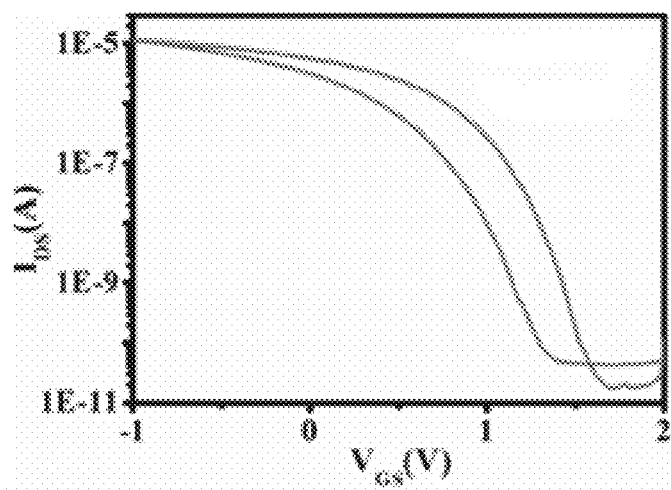
FIG. 10 illustrates a transistor transfer curve diagram of a third thin-film transistor.

Based on the above steps, a complete structure of the oxide TFT and the carbon nanotube TFT can be formed. The transfer curve test of the transistor is shown in FIG. 9 to FIG. 10. FIG. 9 and FIG. 10 respectively reflect the hysteresis performance of the TFTs. In the specific measurement of I-V electrical characteristics, first, scan from the negative electrode to the positive electrode, and then reversely scan from the positive electrode to the negative electrode to obtain two curves. In FIG. 9, Vds=0.5V. In FIG. 10, Vds=−0.5V. FIG. 9 and FIG. 10 illustrate the transfer curves of IZO TFT and carbon nanotube (CNT) TFT, respectively. The mobility and threshold voltage of IZO TFT are 4.06 $cm2V^{-1}S^{-1}$ and Vth=1V. The mobility and threshold voltage of the CNT TFT are 2 $cm2 V^{-1}S^{-1}$ and Vth=0.75V. Both IZO TFT and CNT TFT have sufficient performance.

(6) Printed silver wire connects the Al electrode of the oxide TFT with the Au electrode of the carbon nanotube TFT to form CMOS inverter.

Figure 11:
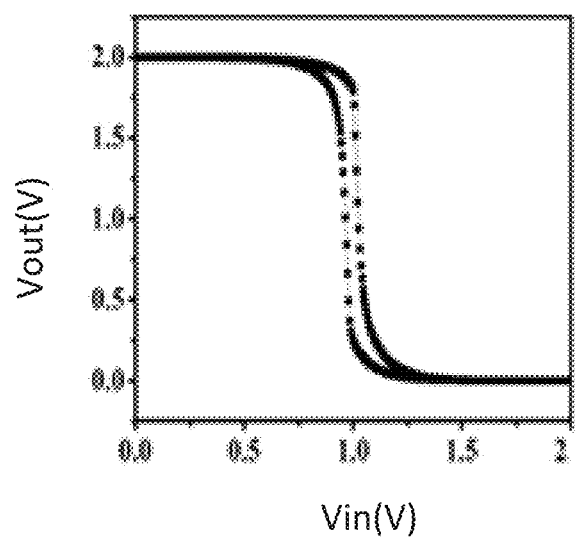
FIG. 11 illustrates an input/output curve diagram of the CMOS inverter of the present disclosure.
Figure 12:
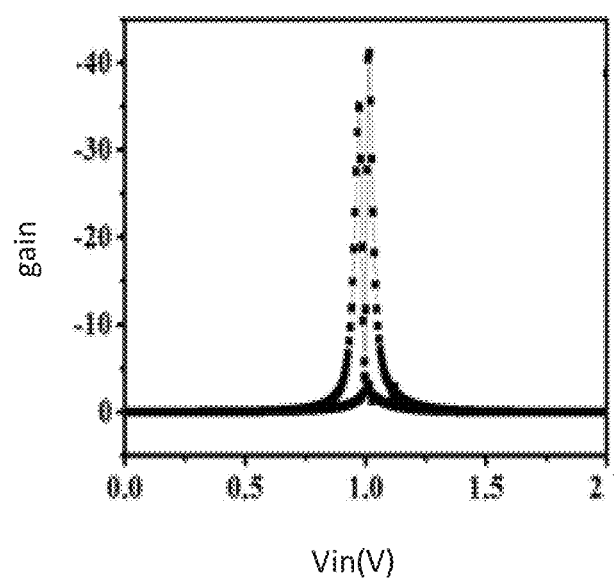
FIG. 12 illustrates a bode plot of the CMOS inverter of the present disclosure.
Figure 13:
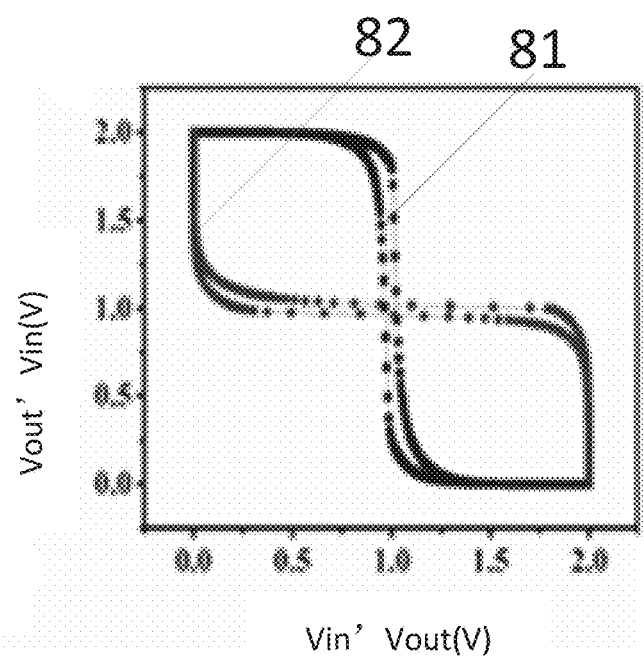
FIG. 13 illustrates a noise tolerance diagram of the CMOS inverter of the present disclosure.

FIGS. 11-13 illustrate an input/output curve diagram, a bode plot, and a noise tolerance diagram of the CMOS inverter, respectively. In FIG. 11, the abscissa represents Vin, and the ordinate represents Vout. In FIG. 12, the abscissa represents Vin, and the ordinate represents gain. In FIG. 13, 81 represents the change curve of the output voltage regarding the input voltage, the abscissa represents Vin ', the ordinate represents Vout', 82 represents the change curve of the input voltage regarding the output voltage, the abscissa represents Vout, and the ordinate represents Vin. Because he curves of 81 and 82 have better symmetry, the noise tolerance is larger. When the threshold voltage of the composite CMOS inverter is about 1V, the gain reaches 40, the noise tolerance reaches 90%, and the performance is better. Therefore, because the manufacturing method of the CMOS inverter of the present disclosure uses solution, power consumption can be reduced and stability can be improved. In addition, it can be applied to large area manufacture to improve production efficiency.

The manufacturing method of the CMOS inverter of the present disclosure includes printing an oxide ink on a substrate, annealing the substrate printed with the oxide ink, and reacting the oxide ink to obtain a first active layer. The oxide ink is a mixed solution of indium nitrate and zinc nitrate. Forming a first source and a first drain on the substrate, and printing a carbon tube ink between the first source and the first drain to form a second active layer for obtaining a first TFT. The carbon tube ink includes semiconductor carbon nanotube and polymer, and the polymer wraps the semiconductor carbon nanotube. Forming a second source and a second drain on two sides of the first active layer to obtain a second TFT and forming wires between the first TFT and the second TFT to obtain a CMOS inverter. Power consumption is reduced and stability is enhanced by adopting solution manufacturing processes.

To conclude, although the present disclosure has been disclosed by above-mentioned preferred embodiments, the above-mentioned preferred embodiments are not limitations to the present disclosure. Variations and modifications can be obtained by a person skilled in the art without departing from the aspect and scope of the present disclosure. Therefore, the protected scope of the present disclosure is subject to the scope defined by the claims.

What is claimed is:

1. A manufacturing method of a complementary metal oxide semiconductor (COMS) inverter, comprising:

printing an oxide ink on a substrate, annealing the substrate printed with the oxide ink, and reacting the oxide ink to obtain a first active layer; wherein the oxide ink is a mixed solution of indium nitrate and zinc nitrate; a molar ratio of the indium nitrate to the zinc nitrate is 1:1, and the substrate comprises a gate;

forming a first source and a first drain on the substrate, and printing a carbon tube ink between the first source and the first drain to form a second active layer for obtaining a first thin-film transistor (TFT); wherein the carbon tube ink comprises a semiconductor carbon nanotube and polymer, and the polymer wraps the semiconductor carbon nanotube;

forming a second source and a second drain on two sides of the first active layer to obtain a second TFT; and forming wires between the first TFT and the second TFT to obtain a CMOS inverter; wherein the first TFT and the second TFT share the gate.

2. The manufacturing method of the CMOS inverter according claim 1, wherein a concentration of the oxide ink ranges from 0.1 mol/L to 0.4 mol/L.

3. The manufacturing method of the CMOS inverter according claim 1, wherein a concentration of the carbon tube ink ranges from 0.0001 mg/mL to 1 mg/mL.

4. The manufacturing method of the CMOS inverter according claim 1, wherein before printing the oxide ink on the substrate and before annealing the substrate printed with the oxide ink further, the method further comprises:
heating the substrate printed with the oxide ink.

5. The manufacturing method of the CMOS inverter according claim 4, wherein annealing the substrate printed with the oxide ink comprises:
annealing the substrate printed with the oxide ink by using a heating equipment, a heating temperature of the heating equipment ranges from 250° C. to 350° C.

6. The manufacturing method of the CMOS inverter according claim 1, wherein before printing the oxide ink on the substrate, the method further comprises:
washing the substrate by using ultraviolet or plasma.

7. The manufacturing method of the CMOS inverter according claim 1, wherein the substrate further comprises a base and an insulating layer on the base, and a material of the insulating layer is selected from at least one of $HfO_2$, $Al_2O_3$, and $SiO_2$.

8. The manufacturing method of the CMOS inverter according claim 7, wherein a thickness of the insulating layer ranges from 50 nm to 100 nm.

9. A manufacturing method of a complementary metal oxide semiconductor (COMS) inverter, comprising:
printing an oxide ink on a substrate, annealing the substrate printed with the oxide ink, and reacting the oxide ink to obtain a first active layer; wherein the oxide ink is a mixed solution of indium nitrate and zinc nitrate;
forming a first source and a first drain on the substrate, and printing a carbon tube ink between the first source and the first drain to form a second active layer for obtaining a first thin-film transistor (TFT); wherein the carbon tube ink comprises a semiconductor carbon nanotube and polymer, and the polymer wraps the semiconductor carbon nanotube;
forming a second source and a second drain on two sides of the first active layer to obtain a second TFT; and
forming wires between the first TFT and the second TFT to obtain a CMOS inverter.

10. The manufacturing method of the CMOS inverter according claim 9, wherein a concentration of the oxide ink ranges from 0.1 mol/L to L-0.4 mol/L.

11. The manufacturing method of the CMOS inverter according claim 9, wherein a molar ratio of the indium nitrate to the zinc nitrate is 1:1.

12. The manufacturing method of the CMOS inverter according claim 9, wherein a concentration of the carbon tube ink ranges from 0.0001 mg/mL to 1 mg/mL.

13. The manufacturing method of the CMOS inverter according claim 9, wherein before printing the oxide ink on the substrate and before annealing the substrate printed with the oxide ink further comprises:
heating the substrate printed with the oxide ink.

14. The manufacturing method of the CMOS inverter according claim 13, wherein annealing the substrate printed with the oxide ink further comprises:
annealing the substrate printed with the oxide ink by using a heating equipment, a heating temperature of the heating equipment ranges from 250° C. to 350° C.

15. The manufacturing method of the CMOS inverter according claim 9, wherein before printing the oxide ink on the substrate further comprises:
washing the substrate by using ultraviolet or plasma.

16. The manufacturing method of the CMOS inverter according claim 9, wherein the substrate further comprises a base and an insulating layer on the base, and a material of the insulating layer is selected from at least one of $HfO_2$, $Al_2O_3$, and $SiO_2$.

17. The manufacturing method of the CMOS inverter according claim 16, wherein a thickness of the insulating layer ranges from 50 nm to 100 nm.

18. The manufacturing method of the CMOS inverter according claim 16, wherein the substrate further comprises a gate, and the first TFT and the second TFT shares the gate.

19. The manufacturing method of the CMOS inverter according claim 9, wherein a material of the first source and a material of the first drain are both copper, and a material of the second source and a material of the second drain are both aluminum.

20. The manufacturing method of the CMOS inverter according claim 9, wherein both a thickness of the second source and a thickness of the second drain range from 100 nm to 170 nm.

* * * * *